United States Patent
Suzuki et al.

(10) Patent No.: US 7,605,059 B2
(45) Date of Patent: Oct. 20, 2009

(54) SEMICONDUCTOR DEVICE AND METHOD OF MANUFACTURING THE SEMICONDUCTOR DEVICE

(75) Inventors: Noriaki Suzuki, Miyagi (JP); Masanori Nagase, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 95 days.

(21) Appl. No.: 11/802,877

(22) Filed: May 25, 2007

(65) Prior Publication Data

US 2007/0290240 A1 Dec. 20, 2007

(30) Foreign Application Priority Data

May 31, 2006 (JP) ............... 2006-151685

(51) Int. Cl.
*H01L 21/326* (2006.01)

(52) U.S. Cl. .................. 438/467; 257/355; 257/357; 257/360; 257/173; 257/E23.149; 438/281; 438/215

(58) Field of Classification Search ............... 438/144, 438/281, 215, 467; 257/355, 256, 357, 358, 257/359, 360, 173, 203, 291, 292, E21.522, 257/E21.523, E21.355, E21.592, E21.596, 257/E23.149, E23.015
See application file for complete search history.

(56) References Cited

U.S. PATENT DOCUMENTS

| | | | |
|---|---|---|---|
| 6,323,076 B1 * | 11/2001 | Wilford | 438/215 |
| 2002/0061630 A1 * | 5/2002 | Lee et al. | 438/467 |
| 2003/0038890 A1 * | 2/2003 | Yamada | 348/312 |
| 2006/0006470 A1 | 1/2006 | Harada | |

FOREIGN PATENT DOCUMENTS

JP 2006-24601 A 1/2006

* cited by examiner

*Primary Examiner*—N Drew Richards
*Assistant Examiner*—Yu-Hsi Sun
(74) *Attorney, Agent, or Firm*—Birch, Stewart, Kolasch, & Birch, LLP.

(57) ABSTRACT

A semiconductor device comprises: a MOS transistor including: a semiconductor substrate; a source region, formed in the semiconductor substrate, that comprises an impurity of a first conductive type; a drain region, formed in the semiconductor substrate, that comprises an impurity of the first conductive type; and a gate electrode, formed through a gate insulating film on the semiconductor substrate, between the source region and the drain region; an impurity region of the first conductive type formed in the semiconductor substrate; an impurity region of a second conductive type to be opposite to the first conductive type formed in the semiconductor substrate; and a wiring provided to connect each of the impurity region of the first conductive type and the impurity region of the second conductive type to the gate electrode.

2 Claims, 3 Drawing Sheets

SEMICONDUCTOR DEVICE AND METHOD OF MANUFACTURING THE SEMICONDUCTOR DEVICE

BACKGROUND OF THE INVENTION

1. Field of the Invention

The present invention relates to a semiconductor device having a MOS transistor comprising a source region formed in a semiconductor substrate and constituted by an impurity of a first conductive type, a drain region formed in the semiconductor substrate and constituted by an impurity of the first conductive type, and a gate electrode formed through a gate insulating film on the semiconductor substrate between the source region and the drain region.

2. Description of the Invention

Examples of a semiconductor device having an MOS transistor include a solid-state image pick-up device. For example, in a CCD type solid-state image pick-up device, a MOS transistor is used for a peripheral circuit such as an amplifier for outputting a signal corresponding to an electric charge generated by a photoelectric converting device and transferred through an electric charge transfer device. In the semiconductor device having the MOS transistor, a gate of the MOS transistor is charged in a manufacturing process so that charge-up is generated and a gate insulating film of the MOS transistor is broken or deteriorated in some cases. For the solid-state image pick-up device, there is often used an ONO structure in which an oxide film, a nitride film and an oxide film are provided in order as the gate insulating film of the MOS transistor. With the structure, therefore, the charge-up can easily be carried out. In recent years, particularly, a gapless microlens and an in-layer lens are introduced so that it is impossible to disregard the influence of a plasma damage due to etch-back, and a threshold voltage of the MOS transistor is apt to fluctuate due to the charge-up.

Therefore, in the related art, a protecting diode has been provided in order to prevent a deterioration in a characteristic of the MOS transistor which is caused by an electric charge stored in a gate electrode by a manufacturing process.

FIG. 5 is a typical sectional view showing a semiconductor device having the related-art MOS transistor.

A p-type well layer 2 is formed on an n-type silicon 1, and a semiconductor substrate is constituted by the n-type silicon 1 and the p well layer 2. A source region 4 constituted by an n-type impurity of a first conductive type and a drain region 5 constituted by an n-type impurity are formed on a surface portion of the p well layer 2, and a gate electrode 6 constituted by a conductive material such as polysilicon is formed on the semiconductor substrate between the source region 4 and the drain region 5 through a gate insulating film 3 having an ONO structure. An enhancement type (E type) N channel MOS transistor is constituted by the source region 4, the drain region 5 and the gate electrode 6.

Moreover, a p-type impurity region 8 of a second conductive type opposite to the first conductive type which serves to fix an electric potential of the p well layer 2 and an n-type impurity region 7 for discharging the electric charge stored in the gate electrode 6 to the semiconductor substrate are formed in a surface portion of the p well layer 2.

A terminal 8t for applying a voltage is connected to the p-type impurity region 8. A terminal S is connected to the source region 4 and a terminal D is connected to the drain region 5. A terminal G for applying a voltage is connected to the gate electrode 6. The terminal G is connected to the n-type impurity region 7. Consequently, the gate electrode 6 and the n-type impurity region 7 are connected to each other.

According to the structure, a bulk diode constituted by the n-type impurity region 7 and the p well layer 2 functions as a protecting diode for protecting the gate electrode 6. For this reason, even if a negative electric charge is stored in the gate electrode 6 during the manufacturing process, it can be discharged to the semiconductor substrate and a deterioration in the characteristic of the N channel MOS transistor can be prevented. Also in the case in which a positive voltage is applied to the terminal G, moreover, the bulk diode is connected in a reverse direction. Therefore, it is possible to prevent a gate current from flowing to the semiconductor substrate. In FIG. 5, the semiconductor device having the N channel MOS transistor is taken as an example. In case of a semiconductor device having a P channel MOS transistor, however, all of the conductive types are set to be opposite conductive types in FIG. 5.

JP-A-2006-24601 can be taken as an example of a document related to a gate electrode protection of the MOS transistor.

In some cases, an electric charge to be stored in a gate electrode of an MOS transistor is positive or negative. With the structure shown in FIG. 5, therefore, the negative electric charge can be discharged to a semiconductor substrate. However, the positive electric charge cannot be fully discharged to the semiconductor substrate. Consequently, there is a possibility that charge-up might be caused.

SUMMARY OF THE INVENTION

The invention has been made in consideration of the circumstances and has an object to provide a semiconductor device capable of preventing charge-up from being caused by charging to a gate electrode in a manufacturing process, and a method of manufacturing the semiconductor device.

(1) A semiconductor device comprising:

a MOS transistor including: a semiconductor substrate; a source region, formed in the semiconductor substrate, that comprises an impurity of a first conductive type; a drain region, formed in the semiconductor substrate, that comprises an impurity of the first conductive type; and a gate electrode, formed through a gate insulating film on the semiconductor substrate, between the source region and the drain region an impurity region of the first conductive type formed in the semiconductor substrate;

an impurity region of a second conductive type to be opposite to the first conductive type formed in the semiconductor substrate; and a wiring provided to connect each of the impurity region of the first conductive type and the impurity region of the second conductive type to the gate electrode.

(2) The semiconductor device according to (1), wherein the wiring comprises: a first wiring provided to connect the gate electrode to the impurity region of the first conductive type; and a second wiring provided to connect the first wiring to the impurity region of the second conductive type, and wherein a first wiring disconnecting terminal for disconnecting the first wiring is provided.

(3) The semiconductor device according to (1), wherein the wiring comprises: a first wiring provided to connect the gate electrode to the impurity region of the first conductive type; and a second wiring provided to connect the first wiring to the impurity region of the second conductive type, and wherein a first wiring disconnecting terminal for disconnecting the first wiring and a second wiring disconnecting terminal for disconnecting the second wiring are provided.

(4) The semiconductor device according to (1), wherein the wiring comprises: a first wiring provided to connect the gate electrode to the impurity region of the first conductive type; and a second wiring provided to connect the first wiring to the impurity region of the second conductive type, and wherein a second wiring disconnecting terminal for disconnecting the second wiring is provided.

(5) The semiconductor device according to any of (1) to (4), further comprising a solid-state image pick-up device.

(6) A method of manufacturing a semiconductor device, the semiconductor device comprising an MOS transistor including: a semiconductor substrate; a source region, formed in the semiconductor substrate, that comprises an impurity of a first conductive type; a drain region, formed in the semiconductor substrate, that comprises an impurity of the first conductive type; and a gate electrode, formed through a gate insulating film on the semiconductor substrate, between the source region and the drain region, the method comprising:

a first step of forming, in the semiconductor substrate, the drain region, the source region, an impurity region of the first conductive type for discharging an electric charge stored in the gate electrode to the semiconductor substrate and an impurity region of a second conductive type opposite to the first conductive type for discharging the electric charge stored in the gate electrode to the semiconductor substrate;

a second step of forming the gate electrode; and a third step of forming a wiring for connecting each of the impurity region of the first conductive type and the impurity region of the second conductive type to the gate electrode after the first step and the second step.

(7) The method of manufacturing a semiconductor device according to (6), wherein the wiring comprises: a first wiring for connecting the gate electrode to the impurity region of the first conductive type; and a second wiring for connecting the first wiring to the impurity region of the second conductive type, and wherein the method further comprises a fourth step of disconnecting the first wiring after the third step.

(8) The method of manufacturing a semiconductor device according to (7), wherein the first wiring serves to connect the gate electrode and the impurity region of the first conductive type through a fuse, and wherein the method further comprises a fifth step of forming a fuse disconnecting terminal to be connected to the fuse and a voltage is applied to the fuse disconnecting terminal to disconnect the fuse, so as to disconnect the first wiring at the fourth step.

(9) The method of manufacturing a semiconductor device according to (6), wherein the wiring comprises: a first wiring for connecting the gate electrode to the impurity region of the first conductive type; and a second wiring for connecting the first wiring to the impurity region of the second conductive type, and wherein the step further comprises: a fourth step of disconnecting the second wiring after the third step; and a fifth step of disconnecting the first wiring after the fourth step.

(10) The method of manufacturing a semiconductor device according to (9), wherein the first wiring serves to connect the gate electrode and the impurity region of the first conductive type through a first fuse, and the second wiring serves to connect the first wiring and the impurity region of the second conductive type through a second fuse, wherein the method further comprises: a sixth step of forming a first fuse disconnecting terminal to be connected to the first fuse; and a seventh step of forming a second fuse disconnecting terminal to be connected to the second fuse, and wherein a voltage is applied to the second fuse disconnecting terminal to disconnect the second fuse, so as to disconnect the second wiring at the fourth step, and a voltage is applied to the first fuse disconnecting terminal to disconnect the first fuse, so as to disconnect the first wiring at the fifth step.

(11) The method of manufacturing a semiconductor device according to (6), wherein the wiring comprises: a first wiring for connecting the gate electrode to the impurity region of the first conductive type; and a second wiring for connecting the first wiring to the impurity region of the second conductive type, and wherein the method further comprises a fourth step of disconnecting the second wiring after the third step.

(12) The method of manufacturing a semiconductor device according to (11), wherein the second wiring serves to connect the first wiring and the impurity region of the second conductive type through a fuse, and wherein the method further comprises a fifth step of forming a fuse disconnecting terminal to be connected to the fuse, and a voltage is applied to the fuse disconnecting terminal to disconnect the fuse, so as to disconnect the second wiring at the fourth step.

(13) The method of manufacturing a semiconductor device according to any of (6) to (12), wherein the semiconductor device comprises a solid-state image pick-up device.

DETAILED DESCRIPTION OF THE INVENTION

Embodiments according to the invention will be described below with reference to the drawings.

First Embodiment

Figure 1:
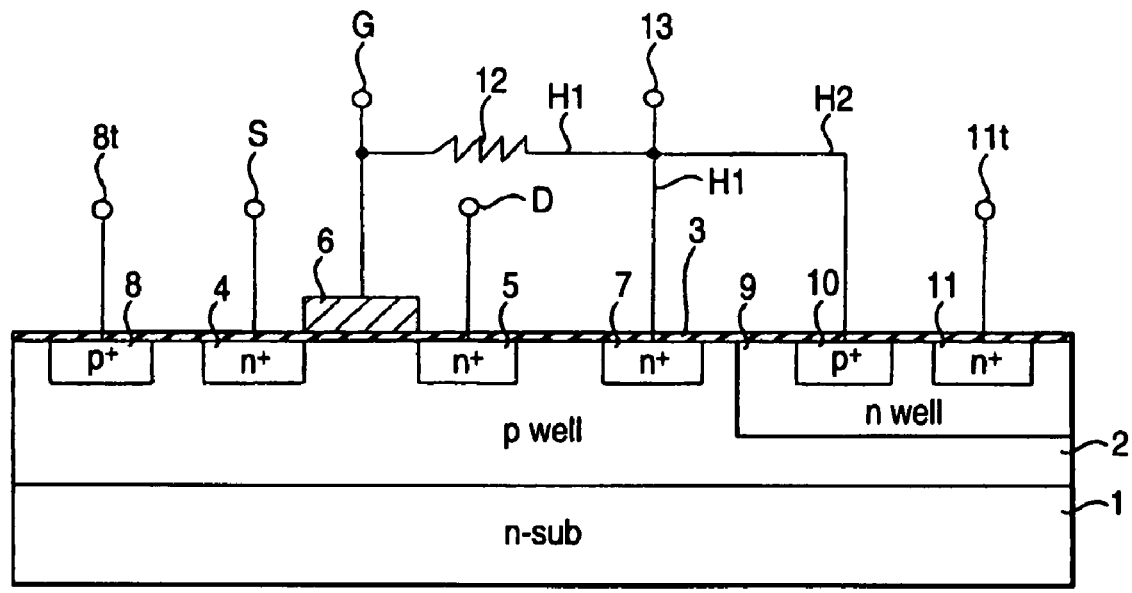
FIG. 1 is a typical sectional view in a middle of a process for manufacturing a semiconductor device having a MOS transistor according to a first embodiment of the invention.

FIG. 1 is a typical sectional view in a middle of a process for manufacturing a semiconductor device having an MOS transistor according to a first embodiment of the invention. In FIG. 1, the same structures as those in FIG. 5 have the same reference numerals.

Figure 5:
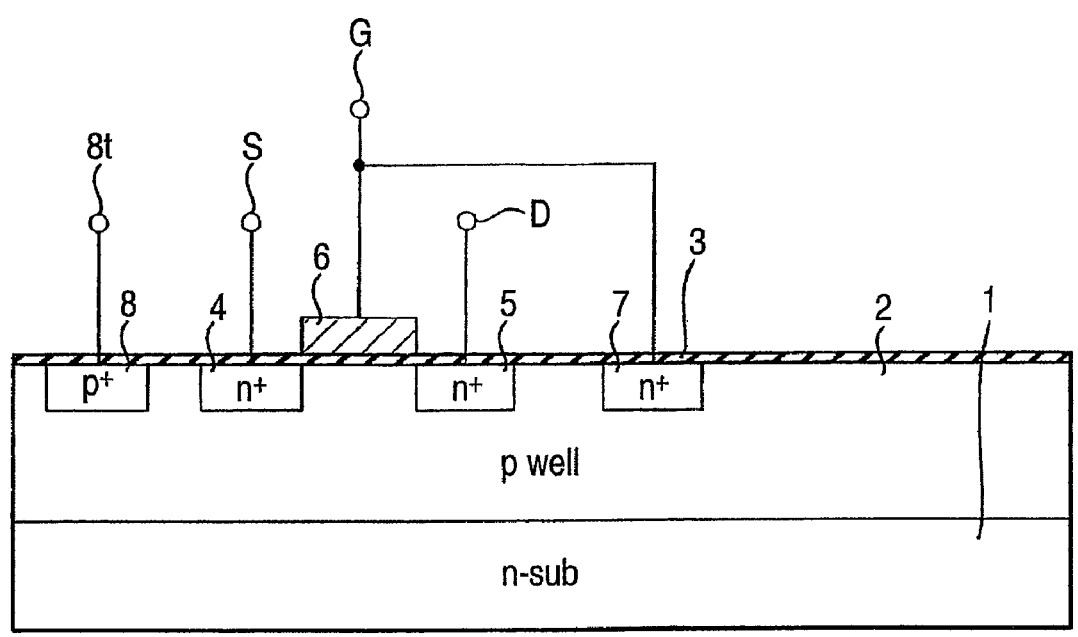
FIG. 5 is a typical sectional view showing a semiconductor device having a MOS transistor according to the related art

In the semiconductor device shown in FIG. 1, an n-type well layer 9 is added to a surface portion of a p well layer 2, and a p-type impurity region 10 for discharging a positive electric charge stored in a gate electrode 6 to a semiconductor substrate and an n-type impurity region 11 for fixing an electric potential of the n well layer 9 are added to a surface portion of the n well layer 9, and furthermore, a wiring H1 for connecting the gate electrode 6 and an n-type impurity region 7 through a fuse 12 formed of polysilicon, a wiring H2 for connecting the wiring H1 to the p-type impurity region 10, a fuse disconnecting terminal 13 which is connected to the wiring H1 in order to apply a voltage to the fuse 12, and a terminal 11$t$ for applying a voltage to the n-type impurity region 11 are added in the semiconductor device shown in FIG. 5.

The process for manufacturing the semiconductor device having the MOS transistor according to the first embodiment of the invention is as follows.

First of all, the P well layer 2, a source region 4, a drain region 5, the n-type impurity regions 7 and 11, p-type impurity regions 8 and 10, the n well layer 9, a gate insulating film 3 and the gate electrode 6 are formed by a well-known CMOS process, and terminals 8t, S, D, G, 13 and 11t, the wiring H1 and the wiring H2 are formed by the well-known CMOS process. This state is shown in FIG. 1. In case of a device having a step of forming a component such as a color filter or a microlens above the gate electrode 6 as in a solid-state image pick-up device, the component is formed by a well-known technique. Finally, a voltage is applied to the terminal 13 to disconnect the fuse 12, thereby disconnecting the wiring H1. Thus, the manufacture of the semiconductor device is completed.

In the semiconductor device thus manufactured, also in the case in which the electric charge is stored in the gate electrode 6 by the manufacturing process after the state shown in FIG. 1, a negative electric charge is discharged through the n-type impurity region 7 and a positive electric charge is discharged through the p-type impurity region 10. Therefore, it is possible to prevent the charge-up. Furthermore, it is also possible to utilize the semiconductor device having the structure as a process charge-up monitor.

When a positive voltage is applied to the terminal G to operate the MOS transistor in a state in which the wiring H1 is not disconnected, a diode constituted by the p-type impurity region 10 and the n well layer 9 is forward connected. For this reason, there is a problem in that a gate current flows to the p-type impurity region 10. In the semiconductor device according to the embodiment, however, a voltage is applied to the terminal 13 to disconnect the fuse 12 after the end of a manufacturing process in which the charge-up might be generated. Also in the case in which the positive voltage is applied to the terminal G, therefore, the gate current can be prevented from leaking to the semiconductor substrate. Thus, it is possible to solve the problems.

For a timing to disconnect the fuse 12, it is possible to select either a first timing after all of the components of the semiconductor device are formed in a wafer and before the wafer is subjected to dicing into a chip and a second timing after the change into the chip. In the case in which the first timing is set, the electric charge stored in the gate electrode 6 cannot be discharged into the semiconductor substrate during the dicing. For this reason, there is a possibility that a characteristic of the MOS transistor might be deteriorated. On the other hand, in the case in which the second timing is set, the electric charge stored in the gate electrode 6 can be discharged to the semiconductor substrate during the dicing. Therefore, it is possible to prevent the deterioration in the characteristic of the MOS transistor. In the case in which the second timing is set, moreover, the semiconductor device can be inspected only on a chip level. On the other hand, in the case in which the first timing is set, the semiconductor device can be inspected on both a wafer level and the chip level.

While the description has been given on assumption that the MOS transistor provided in the semiconductor device is set to have an E type, moreover, it is a matter of course that the same advantages can be obtained also in case of a depression type (D type). While the description has been given on assumption that the MOS transistor provided in the semiconductor device is set to be the N channel MOS transistor, furthermore, it is a matter of course that a P channel MOS transistor may be used. In this case, there is provided a structure in which all of the conductive types are reversed in FIG. 1.

Second Embodiment

Figure 2:
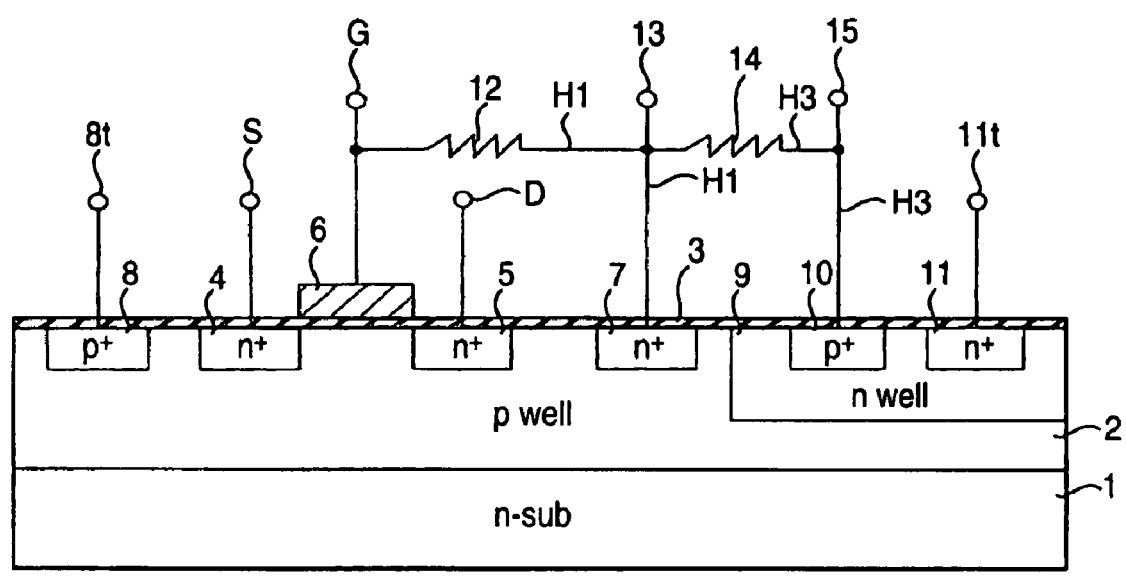
FIG. 2 is a typical sectional view in a middle of a process for manufacturing a semiconductor device having a MOS transistor according to a second embodiment of the invention.

FIG. 2 is a typical sectional view in a middle of a process for manufacturing a semiconductor device having an MOS transistor according to a second embodiment of the invention. In FIG. 2, the same structures as those in FIG. 1 have the same reference numerals.

The semiconductor device shown in FIG. 2 has such a structure that a wiring H3 is provided in place of the wiring H2 and a terminal 15 is connected to the wiring H3 in the semiconductor device shown in FIG. 1. The wiring H3 serves to connect a wiring H1 to a p-type impurity region 10 through a fuse 14 such as polysilicon. The terminal 15 is a fuse disconnecting terminal for applying a voltage to the fuse 14.

The process for manufacturing the semiconductor device having the MOS transistor according to the second embodiment of the invention is as follows.

First of all, a P well layer 2, a source region 4, a drain region 5, n-type impurity regions 7 and 11, p-type impurity regions 8 and 10, an n well layer 9, a gate insulating film 3 and a gate electrode 6 are formed by a well-known CMOS process, and terminals 8t, S, D, G, 13, 11t and 15, the wiring H1 and the wiring H3 are then formed by the well-known CMOS process. This state is shown in FIG. 2. In case of a device having a step of forming a component such as a color filter or a microlens above the gate electrode 6 as in a solid-state image pick-up device, the component is formed by a well-known technique. Thereafter, a voltage is applied to the terminal 15 to disconnect the fuse 14, thereby disconnecting the wiring H3, and subsequently, a voltage is applied to the terminal 13 to disconnect a fuse 12, thereby disconnecting the wiring H1. Thus, the manufacture of the semiconductor device is completed.

In the semiconductor device thus manufactured, also in the case in which an electric charge is stored in the gate electrode 6 by the manufacturing process after the state shown in FIG. 2, a negative electric charge is discharged through the n-type impurity region 7 and a positive electric charge is discharged through the p-type impurity region 10. Therefore, it is possible to prevent charge-up. In the semiconductor device according to the first embodiment, it is necessary to disconnect the fuse 12 before an inspection in order to inspect the semiconductor device on a wafer level. As a result, the charge-up is caused by a subsequent dicing step. On the other hand, according to the semiconductor device in accordance with the embodiment, it is possible to disconnect the fuse 14 to inspect the semiconductor device on the wafer level, and to disconnect the fuse 12 to inspect the semiconductor device on a chip level after the dicing step. In other words, also in the case in which the inspection is carried out on the wafer level, it is possible to leave the wiring H1 at the dicing step. Therefore, it is possible to discharge, to the semiconductor substrate, a negative electric charge stored in the gate electrode 6 at the dicing step. Thus, it is possible to decrease a probability that the charge-up is generated.

While the description has been given on assumption that the MOS transistor provided in the semiconductor device is set to be an N channel MOS transistor, it is a matter of course that a P channel MOS transistor may be employed. In this case, there is provided a structure in which all of the conductive types are reversed in FIG. 2.

Third Embodiment

Figure 3:
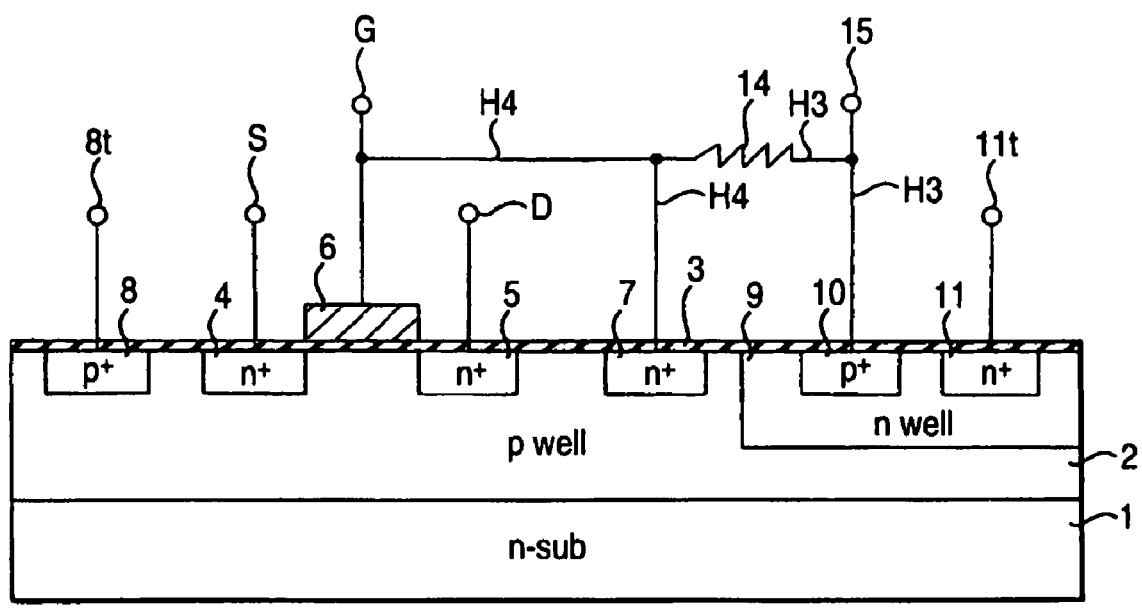
FIG. 3 is a typical sectional view in a middle of a process for manufacturing a semiconductor device having a MOS transistor according to a third embodiment of the invention.

FIG. 3 is a typical sectional view in a middle of a process for manufacturing a semiconductor device having an MOS transistor according to a third embodiment of the invention. In FIG. 3, the same structures as those in FIG. 2 have the same reference numerals.

The semiconductor device shown in FIG. 3 has such a structure that a wiring H4 is provided in place of the wiring H1 and the terminal 13 is omitted in the semiconductor device shown in FIG. 2. The wiring H4 serves to connect a gate electrode 6 to an n-type impurity region 7.

The process for manufacturing the semiconductor device having the MOS transistor according to the third embodiment of the invention is as follows.

First of all, a P well layer 2, a source region 4, a drain region 5, n-type impurity regions 7 and 11, p-type impurity regions 8 and 10, an n well layer 9, a gate insulating film 3 and the gate electrode 6 are formed by a well-known CMOS process, and terminals 8t, S, D, G, 11t and 15, the wiring H4 and a wiring H3 are then formed by the well-known CMOS process. This state is shown in FIG. 3. In case of a device having a step of forming a component such as a color filter or a microlens above the gate electrode 6 as in a solid-state image pick-up device, the component is formed by a well-known technique. Thereafter, a voltage is applied to the terminal 15 to disconnect a fuse 14, thereby disconnecting the wiring H3. Thus, the manufacture of the semiconductor device is completed.

In the semiconductor device thus manufactured, also in the case in which an electric charge is stored in the gate electrode 6 by the manufacturing process after the state shown in FIG. 3, a negative electric charge is discharged through the n-type impurity region 7 and a positive electric charge is discharged through the p-type impurity region 10. Therefore, it is possible to prevent charge-up. In the semiconductor device according to the first embodiment, it is necessary to disconnect a fuse 12 before an inspection in order to inspect the semiconductor device on a wafer level. As a result, the charge-up is caused by a subsequent dicing step. On the other hand, according to the semiconductor device in accordance with the third embodiment, it is possible to leave the wiring H4 at the dicing step. Therefore, it is possible to discharge, to a semiconductor substrate, a negative electric charge stored in the gate electrode 6 at the dicing step. Thus, it is possible to decrease a probability that the charge-up is generated.

Figure 4:
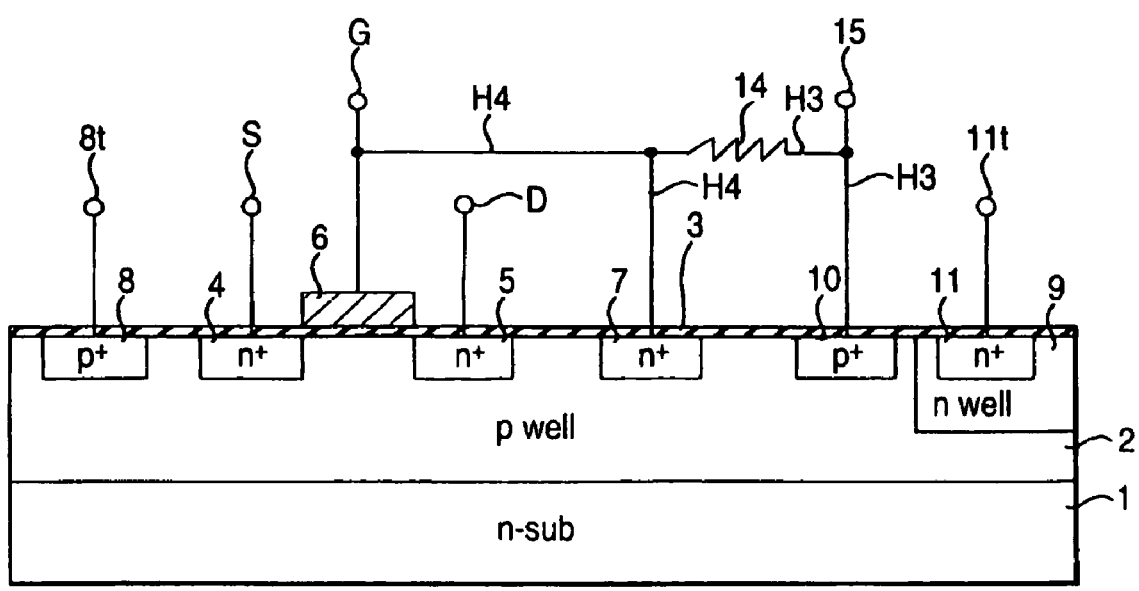
FIG. 4 is a typical sectional view in the middle of the process for manufacturing a semiconductor device having a MOS transistor according to the third embodiment of the invention.

In the semiconductor device according to this embodiment, when a voltage is applied to the terminal G, the fuse 14 has already been disconnected. Even if the p-type impurity region 10 is formed in the p well layer 2 as shown in FIG. 4, therefore, there is no problem.

While the description has been given on assumption that the MOS transistor provided in the semiconductor device is set to be an N channel MOS transistor, moreover, it is a matter of course that a P channel MOS transistor may be employed. In this case, there is provided a structure in which all of the conductive types are reversed in FIGS. 3 and 4.

While the wirings H1 and H3 are disconnected by applying a voltage to the fuse to disconnect the fuse in the first to third embodiments, the method is not restricted but the wirings H1 and H3 may be disconnected through a laser, for example. In the semiconductor device shown in FIG. 1, for instance, it is also possible to employ a structure in which the fuse 12 and the terminal 13 are omitted to form all of the components and to then disconnect the wiring H1 through a laser, thereby completing the manufacture of the semiconductor device, to disconnect the wiring H2 through the laser to complete the manufacture of the semiconductor device, or to disconnect the wiring H2 through the laser and to then disconnect the wiring H1 through the laser, thereby completing the manufacture of the semiconductor device.

In the solid-state image pick-up device in the semiconductor device, particularly, the gate electrode is easily charged during the manufacturing process. In the case in which the semiconductor device is the solid-state image pick-up device, therefore, the structures described in the first to third embodiments are the most effective.

According to the invention, it is possible to provide a semiconductor device capable of preventing charge-up from being caused by charging to a gate electrode in a manufacturing process, and a method of manufacturing the semiconductor device.

The entire disclosure of each and every foreign patent application from which the benefit of foreign priority has been claimed in the present application is incorporated herein by reference, as if fully set forth.

What is claimed is:

1. A semiconductor device comprising:
  a MOS transistor including:
  a semiconductor substrate;
  a source region, formed in the semiconductor substrate, that comprises an impurity of a first conductive type;
  a drain region, formed in the semiconductor substrate, that comprises an impurity of the first conductive type; and
  a gate electrode, formed through a gate insulating film on the semiconductor substrate, between the source region and the drain region;
  an impurity region of the first conductive type formed in the semiconductor substrate;
  an impurity region of a second conductive type opposite the first conductive type formed in the semiconductor substrate;
  a first wiring connecting the gate electrode to the impurity region of the first conductive type;
  a second wiring connecting the first wiring to the impurity region of the second conductive type;
  a first wiring disconnecting terminal for disconnecting the first wiring; and
  a second wiring disconnecting terminal for disconnecting the second wiring.

2. A method of manufacturing a semiconductor device,
  forming, in a semiconductor substrate, a drain region, a source region, an impurity region of a first conductive type for discharging an electric charge stored in a gate electrode to the semiconductor substrate and an impurity region of a second conductive type opposite to the first conductive type for discharging the electric charge stored in the gate electrode to the semiconductor substrate;
  forming the gate electrode;
  forming a first wiring connecting the gate electrode to the impurity region of the first conductive type;
  forming a second wiring connecting the first wiring to the impurity region of the second conductive type;
  disconnecting the first and second wiring after forming the second wiring by
    forming a first fuse disconnecting terminal to be connected to a first fuse;
    forming a second fuse disconnecting terminal to be connected to a second fuse;
    applying a voltage to the second fuse disconnecting terminal to disconnect the second fuse; and
    applying a voltage to the first fuse disconnecting terminal to disconnect the first fuse.

* * * * *